(12) United States Patent
Ishii et al.

(10) Patent No.: US 12,140,753 B2
(45) Date of Patent: Nov. 12, 2024

(54) OPTICAL DEVICE AND OPTICAL UNIT INCLUDING OPTICAL DEVICE

(71) Applicant: Murata Manufacturing Co., Ltd., Nagaokakyo (JP)

(72) Inventors: Yuuki Ishii, Nagaokakyo (JP); Katsumi Fujimoto, Nagaokakyo (JP); Hitoshi Sakaguchi, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 992 days.

(21) Appl. No.: 17/108,030

(22) Filed: Dec. 1, 2020

(65) Prior Publication Data
US 2021/0080714 A1    Mar. 18, 2021

Related U.S. Application Data

(63) Continuation of application No. PCT/JP2020/009609, filed on Mar. 6, 2020.

(30) Foreign Application Priority Data

May 16, 2019  (JP) .................................. 2019-093163

(51) Int. Cl.
*G02B 27/00* (2006.01)
*B08B 3/12* (2006.01)
(Continued)

(52) U.S. Cl.
CPC ............ *G02B 27/0006* (2013.01); *B08B 3/12* (2013.01); *B08B 7/028* (2013.01); *B60S 1/60* (2013.01);
(Continued)

(58) Field of Classification Search
CPC ...... G02B 27/0006; G02B 7/02; G02B 13/16; B08B 3/12; B08B 7/028; B60S 1/60;
(Continued)

(56) References Cited

U.S. PATENT DOCUMENTS

2008/0272672 A1    11/2008  Higashionji et al.
2009/0153966 A1*    6/2009  Matsumoto .......... H04N 23/811
                                                                    359/508
(Continued)

FOREIGN PATENT DOCUMENTS

CN    109076152 A    12/2018
JP    06-258713 A     9/1994
(Continued)

OTHER PUBLICATIONS

Machine translation of WO-2017110563-A1 (Year: 2017).*
(Continued)

*Primary Examiner* — Erin F Bergner
(74) *Attorney, Agent, or Firm* — Keating & Bennett, LLP

(57) ABSTRACT

An optical device includes a protective cover, a housing, and a vibrating body that vibrates the protective cover by selecting, from multiple vibration modes in which the protective cover is vibrated, a cleaning mode in which vibration displacement of the protective cover becomes maximum and a higher-order heating mode in which the number of nodes is larger than that in the cleaning mode. In the heating mode, the position of the maximum vibration displacement in this vibration mode is within a region of the protective cover that corresponds to the field of view of the optical sensor.

22 Claims, 9 Drawing Sheets

(51) Int. Cl.
*B08B 7/02* (2006.01)
*B60S 1/60* (2006.01)
*G02B 7/02* (2021.01)
*G03B 17/02* (2021.01)
*G03B 17/56* (2021.01)
*H04N 23/50* (2023.01)
*H10N 30/20* (2023.01)

(52) U.S. Cl.
CPC ............... *G02B 7/02* (2013.01); *G03B 17/02* (2013.01); *G03B 17/56* (2013.01); *H04N 23/50* (2023.01); *H10N 30/20* (2023.02)

(58) Field of Classification Search
CPC ........... B60S 1/56; G03B 17/02; G03B 17/56; G03B 17/08; G03B 17/55; H04N 23/50; H04N 23/811; H04N 23/52; H10N 30/20; B06B 1/0644
See application file for complete search history.

(56) References Cited

U.S. PATENT DOCUMENTS

| | | | | |
|---|---|---|---|---|
| 2010/0316371 | A1* | 12/2010 | Kawai | H04N 23/811 15/94 |
| 2012/0194910 | A1 | 8/2012 | Sumioka | |
| 2018/0246323 | A1 | 8/2018 | Fedigan et al. | |
| 2019/0033685 | A1 | 1/2019 | Fujimoto et al. | |
| 2019/0054324 | A1 | 2/2019 | Tsutsumi | |
| 2020/0055087 | A1 | 2/2020 | Fujimoto et al. | |

FOREIGN PATENT DOCUMENTS

| | | | | |
|---|---|---|---|---|
| JP | 2008-083298 A | 4/2008 | | |
| JP | 2009135910 A | 6/2009 | | |
| JP | 2017-085276 A | 5/2017 | | |
| WO | WO-2017110563 A1 * | 6/2017 | ......... | G02B 27/0006 |
| WO | 2017/138090 A1 | 8/2017 | | |
| WO | 2018207395 A1 | 11/2018 | | |

OTHER PUBLICATIONS

Official Communication issued in International Patent Application No. PCT/JP2020/009609, mailed on May 12, 2020.

Extended European Search Report in EP20785667.5, mailed May 25, 2023, 9 pages.

First Office Action in CN202080006081.X, mailed Sep. 5, 2022, 10 pages.

* cited by examiner

OPTICAL DEVICE AND OPTICAL UNIT INCLUDING OPTICAL DEVICE

CROSS REFERENCE TO RELATED APPLICATIONS

This application claims the benefit of priority to Japanese Patent Application No. 2019-093163 filed on May 16, 2019 and is a Continuation Application of PCT Application No. PCT/JP2020/009609 filed on Mar. 6, 2020. The entire contents of each application are hereby incorporated herein by reference.

BACKGROUND OF THE INVENTION

1. Field of the Invention

The present invention relates to an optical device and an optical unit that includes an optical device.

2. Description of the Related Art

In recent years, an optical unit that includes an optical sensor such as an imaging element has been mounted on a front portion or a rear portion of a vehicle, and an image obtained by the optical unit has been used so as to control a safety device or so as to perform autonomous driving control. Since such an optical unit is often mounted on the outside of a vehicle, foreign matters such as raindrops, mud, and dust may sometimes adhere to a light-transmitting member (a lens or a protective cover) that covers the exterior of the optical unit. When a foreign matter adheres to the light-transmitting member, the adhered foreign matter is captured in an image that is obtained by the optical unit, so that a clear image cannot be obtained. In addition, in cold weather, ice or frost adheres to the surface of the light-transmitting member of the optical unit mounted on the outside of the vehicle, so that the optical unit cannot obtain a clear image.

Accordingly, an optical unit described in U.S. Patent Application Publication No. 2018/0246323 is capable of vibrating a light-transmitting member at a first frequency (in a cleaning mode) in order to remove a foreign matter adhering to a surface of the light-transmitting member and also vibrates the light-transmitting member at a second frequency (in a heating mode) in order to heat the light-transmitting member. More specifically, in the optical unit described in U.S. Patent Application Publication No. 2018/0246323, a controller circuit switches the mode in which the light-transmitting member is vibrated between the cleaning mode and the heating mode.

In the optical unit described in U.S. Patent Application Publication No. 2018/0246323, although the light-transmitting member is heated at the second frequency, which is different from the first frequency of the cleaning mode, a portion that is most desired to be vibrated and heated (e.g., the visual field range of the optical sensor) is not selectively heated, and the heating efficiency is low.

SUMMARY OF THE INVENTION

Preferred embodiments of the present invention provide optical devices that are each able to remove a foreign matter adhering to a light-transmitting cover and selectively generate heat within the region of the light-transmitting cover, and optical units that include the optical devices.

An optical device according to a preferred embodiment of the present invention includes a light transmitter that is provided in a viewing direction of an optical sensor, a housing at one end of which the light transmitter is held, and a vibrating body that vibrates the light transmitter by a piezoelectric element provided along another end of the housing. The vibrating body vibrates the light transmitter by selecting, from a plurality of vibration modes in which the light transmitter is vibrated, a first vibration mode in which vibration displacement of the light transmitter becomes maximum and a higher-order second vibration mode in which the number of nodes is larger than the number of nodes in the first vibration mode. In the second vibration mode, a position of a maximum vibration displacement in the second vibration mode is within a region of the light transmitter that corresponds to a field of view of the optical sensor.

An optical device according to another preferred embodiment of the present invention includes a light transmitter that is provided in a viewing direction of an optical sensor, a housing at one end of which the light transmitter is held, a vibrating body that vibrates the light transmitter by a piezoelectric element provided along another end of the housing, and a switch that switches a vibration mode in which the light transmitter is vibrated. The vibrating body vibrates the light transmitter by selecting, from a plurality of vibration modes in which the light transmitter is vibrated, a first vibration mode in which vibration displacement of the light transmitter becomes maximum and a higher-order second vibration mode in which the number of nodes is larger than the number of nodes in the first vibration mode. The switch switches to, as the second vibration mode, a vibration mode in which a maximum vibration displacement occurs at a position in the region of the light transmitter corresponding to the field of view of the optical sensor in accordance with the position.

An optical unit according to another preferred embodiment of the present invention includes an optical sensor and the above-described optical device.

According to the preferred embodiments of the present invention, since a higher-order second vibration mode is selected to vibrate a light transmitter, a foreign matter adhering to the light transmitter is able to be removed, and heat is able to be selectively generated within the region of the light transmitter.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
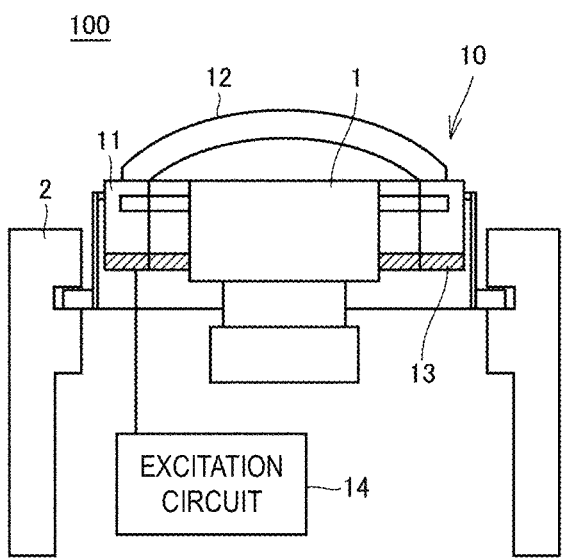
FIGS. 1A and 1B are diagrams illustrating an optical unit according to a first preferred embodiment of the present invention.

Optical units according to preferred embodiments of the present invention will be described in detail below with reference to the drawings. Note that components denoted by the same reference signs in the drawings are the same or correspond to each other.

Figure 1B:
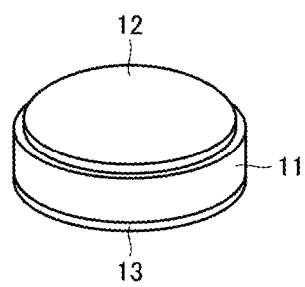

An optical unit according to a first preferred embodiment will be described below with reference to the drawings. FIGS. 1A and 1B are diagrams illustrating an optical unit 100 according to the first preferred embodiment. FIG. 1A is a sectional view of the optical unit 100, and FIG. 1B is a diagram illustrating the appearance of the optical unit 100. The optical unit 100 is mounted on, for example, a front portion, a rear portion, or the like of a vehicle and obtains information regarding the shape, the color, the temperature, and so forth of an object and information regarding, for example, the distance to an object. The optical unit 100 includes an optical sensor 1 that obtains information regarding the shape, the color, the temperature, and so forth of an object and information regarding, for example, the distance to an object and an optical device 10 that holds the optical sensor 1. The optical device 10 includes an optical guide that guides light to a sensor surface of the optical sensor 1. The optical unit 100 is mounted on, for example, a vehicle as a result of the optical device 10 being fixed onto a support 2. Note that the optical unit 100 is not limited to being mounted on a vehicle and may be mounted on other apparatuses, for example, a ship or an aircraft.

When the optical unit 100 is implemented in an outdoor application by being mounted on a vehicle or the like, foreign matters, for example, raindrops, mud, and dust may sometimes adhere to a light transmitter (a lens or a protective light cover) that is provided in the viewing direction of the optical sensor 1 and that covers the exterior of the optical sensor 1. Accordingly, the optical device 10 includes a removing structure that removes a foreign matter adhering to the light transmitter.

More specifically, the optical device 10 includes a housing 11, a transparent protective cover (e.g., a lens or a light transmitter) 12 that is provided on a surface of the housing 11, and a vibrating body 13 that vibrates the protective cover 12. The vibrating body 13 is connected to an excitation circuit 14 and vibrates the protective cover 12 based on a signal from the circuit. The vibrating body 13 is the removing structure and removes a foreign matter adhering to the protective cover 12 by vibrating the protective cover 12. Note that the optical sensor 1 is provided farther inside than the protective cover 12 and is held by the housing 11.

The housing 11 has a cylindrical or substantially cylindrical shape and includes, for example, a metal or a synthetic resin. Note that the housing 11 may have a different shape, for example, a rectangular columnar shape. The protective cover 12 is provided at one end of the housing 11, and the vibrating body 13 is provided at the other end of the housing 11.

For example, the vibrating body 13 is a piezoelectric vibrator (a piezoelectric element) that has a cylindrical or substantially cylindrical shape or a shape determined by dividing a cylindrical or substantially cylindrical shape into a plurality of portions. The piezoelectric vibrator vibrates, for example, by being polarized in a thickness direction or a radial direction. The piezoelectric vibrator includes a PZT-based piezoelectric ceramic. A different piezoelectric ceramic, for example, (K, Na) NbO$_3$ may be included. Alternatively, a piezoelectric single crystal such as LiTaO$_3$ may be included.

The protective cover 12 has a dome shape extending from the one end of the housing 11. In the present preferred embodiment, this dome shape is a hemispherical shape. Note that the viewing angle of the optical sensor 1 is, for example, about 170 degrees. The dome shape is not limited to a hemispherical shape and may be a shape in which a cylinder is contiguous to a hemisphere or a shape having a surface curved less than a hemisphere. The protective cover 12 may be a flat plate. The entire protective cover 12 is at least transparent to light of a wave length targeted by the optical sensor 1. Thus, the light that passes through the protective cover 12 may be visible light or invisible light.

In the present preferred embodiment, the protective cover 12 is made of glass. However, the protective cover 12 is not limited to including glass and may be made of a resin, for example, a transparent plastic. Alternatively, the protective cover 12 may be made of a light-transmitting ceramic. According to the application, tempered glass may be included. By including tempered glass, the strength of the protective cover 12 is able to be significantly improved. In the case where the protective cover 12 includes a resin, examples of the resin includes acrylic, cycloolefin, polycarbonate and polyester. In addition, a coating layer including DLC or the like may be formed over a surface of the protective cover 12 in order to enhance the strength of the protective cover 12, and a hydrophilic film, a water-repellent film, or an oleophilic or oleophobic coating layer may be formed, for example, to provide soil resistance to the surface or removing raindrops from the surface.

The protective cover 12 may be a simple glass cover or may be an optical component, for example, a concave lens, a convex lens, or a flat lens. An additional optical component may be provided farther inside than the protective cover 12. The method of joining the protective cover 12 and the housing 11 to each other is not particularly limited. The protective cover 12 and the housing 11 may be joined to each other by an adhesive, by welding them together, by fitting them together, by press-fitting them together, or the like.

The optical sensor 1 described above is positioned farther inside than the protective cover 12. The optical sensor 1 may be an image sensor, for example, a complementary metal oxide semiconductor (CMOS) or a charge coupled device (CCD), or may be a light detection and ranging (LiDAR) sensor that uses a laser beam. In the case of implementing an image sensor as the optical sensor 1, the optical sensor 1 captures an image of an image capturing target, which is present outside, through the protective cover 12.

Another example of the removing structure, which removes a foreign matter adhering to the light transmitter, besides the vibrating body 13 is a rotation mechanism that rotates the light-transmitting cover. A rotation mechanism may be included in combination with the vibrating body 13 to provide the removing structure.

The vibrating body 13 is provided as the removing structure (driven in a cleaning mode) that removes a foreign matter adhering to the protective cover 12 by vibrating the protective cover 12, and the vibrating body 13 is also able to generate heat (driven in a heating mode) that vibrates the protective cover 12 to heat the protective cover 12 by utilizing mechanical loss of vibration. Driving of the vibrating body 13 in the cleaning mode and driving of the vibrating body 13 in the heating mode will be described below.

Figure 2A:
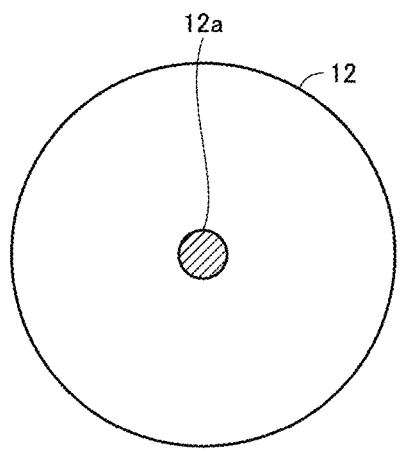
FIGS. 2A to 2C are diagrams illustrating a vibrating body according to the first preferred embodiment of the present invention driven in a cleaning mode.
Figure 2B:
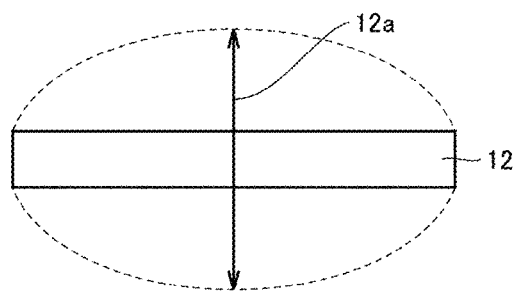
Figure 2C:
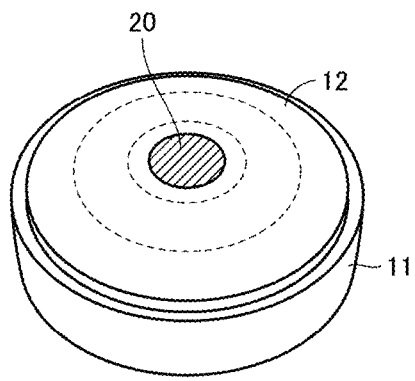

FIGS. 2A to 2C are diagrams illustrating the vibrating body 13 according to the first preferred embodiment driven in the cleaning mode. FIG. 2A illustrates the position of a maximum vibration displacement 12a of the protective cover 12 when the vibrating body 13 is driven in the cleaning mode. FIG. 2B illustrates the amplitude of vibration when the protective cover 12 is assumed to be a flat plate and vibrated in the cleaning mode. FIG. 2C illustrates a result of finite element method (FEM) analysis in the case where the vibrating body 13 is driven in the cleaning mode.

The vibrating body 13 is able to be driven in the cleaning mode by driving the vibrating body 13 at, for example, about 50 kHz. When the vibrating body 13 is driven in the cleaning mode, as illustrated in FIG. 2A, the maximum vibration displacement 12a occurs at a center or substantially center portion of the protective cover 12. As illustrated in FIG. 2B, when the protective cover 12 is assumed to be a flat plate, a portion at which the amount of vibration displacement is large is the center or substantially center portion of the protective cover 12 (antinode of vibration), and a portion at which the amount of vibration displacement is small is the peripheral edge portion of the protective cover 12 (node of vibration).

A mechanical vibration mode of a circular component or element may be expressed as a (x, y) vibration mode. Here, the letter x represents the number of nodes existing in a radial direction, and the letter y represents the number of nodes existing in a direction in which the circular component or element circulates. The letters x and y each represent an integer. In the protective cover 12 illustrated in FIG. 2A, since there are no nodes in the radial direction, x=0 is satisfied, and since there are also no nodes in the direction in which the protective cover 12 circulates, y=0 is satisfied. Thus, the vibration mode is a (0, 0) vibration mode. As illustrated in FIG. 2C, the result of FEM analysis when the protective cover 12 is vibrated in the (0, 0) vibration mode is a concentric circle mode in which a maximum vibration displacement portion 20 is located at the top portion (center or substantially center portion) of the dome shape of the protective cover 12.

Figure 3A:
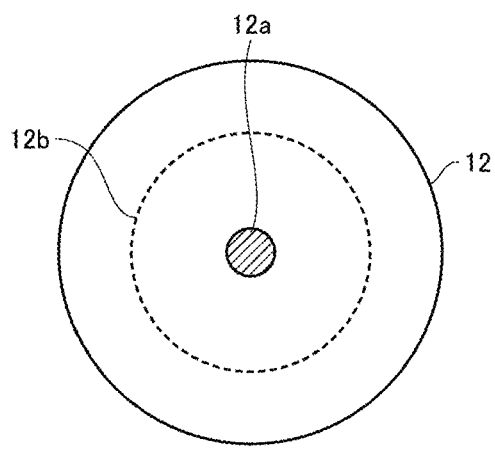
FIGS. 3A to 3C are diagrams illustrating the vibrating body according to the first preferred embodiment of the present invention driven in a heating mode.
Figure 3B:
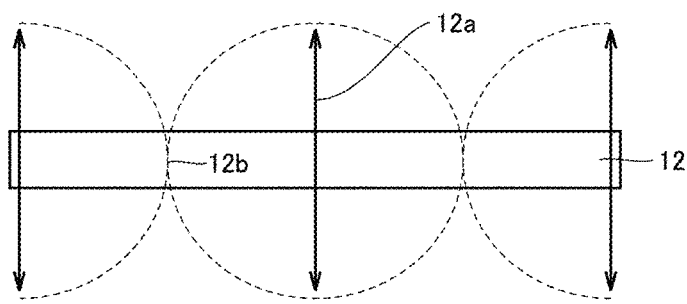
Figure 3C:
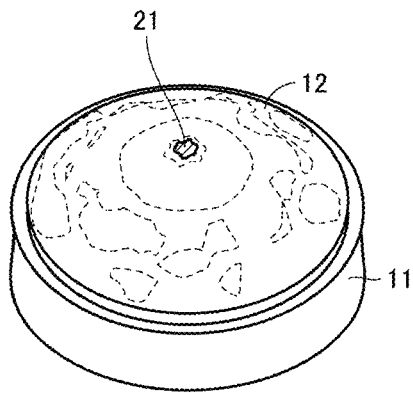

FIGS. 3A to 3C are diagrams illustrating the vibrating body 13 according to the first preferred embodiment driven in the heating mode. FIG. 3A illustrates the position of the maximum vibration displacement 12a of the protective cover 12 when the vibrating body 13 is driven in the heating mode. FIG. 3B illustrates the amplitude of vibration when the protective cover 12 is assumed to be a flat plate and vibrated in the heating mode. FIG. 3C illustrates a result of FEM analysis in the case where the vibrating body 13 is driven in the heating mode.

The vibrating body 13 is able to be driven in the heating mode by driving the vibrating body 13 at, for example, about 500 kHz. When the vibrating body 13 is driven in the heating mode, as illustrated in FIG. 3A, the maximum vibration displacement 12a occurs at the center or substantially center portion of the protective cover 12, and a node 12b occurs in a radial direction. As illustrated in FIG. 3B, when the protective cover 12 is assumed to be a flat plate, a portion at which the amount of vibration displacement is large is the center or substantially center portion and the peripheral edge portion of the protective cover 12 (antinodes of vibration), and a portion at which the amount of vibration displacement is small is located at a position between the center or substantially center portion of the protective cover 12 and the peripheral edge portion of the protective cover 12 (node of vibration). Note that the maximum vibration displacement 12a in the heating mode is within a region of the protective cover 12 that corresponds to the field of view of the optical sensor 1. Thus, ice or frost formed within the region of the protective cover 12 corresponding to the field of view of the optical sensor 1 is able to be quickly removed.

In the protective cover 12 illustrated in FIG. 3A, since there is the node 12b in the radial direction, x=1 is satisfied, and since there are no nodes in the direction in which the protective cover 12 circulates, y=0 is satisfied. Thus, the vibration mode is a (1, 0) vibration mode. As illustrated in FIG. 3C, the result of FEM analysis when the protective cover 12 is vibrated in the (1, 0) vibration mode is a concentric circle mode in which a maximum vibration displacement portion 21 is located at the top portion of the dome shape of the protective cover 12. Note that the number of nodes in the vibration mode of the cleaning mode is smaller than that in the vibration mode of the heating mode. In other words, when the number of nodes x=n(≥0), and the number of nodes x in the vibration mode of the heating mode=m(>0), the vibration mode of the cleaning mode is a higher-order vibration mode in which a relationship of n>m is satisfied.

Figure 4:
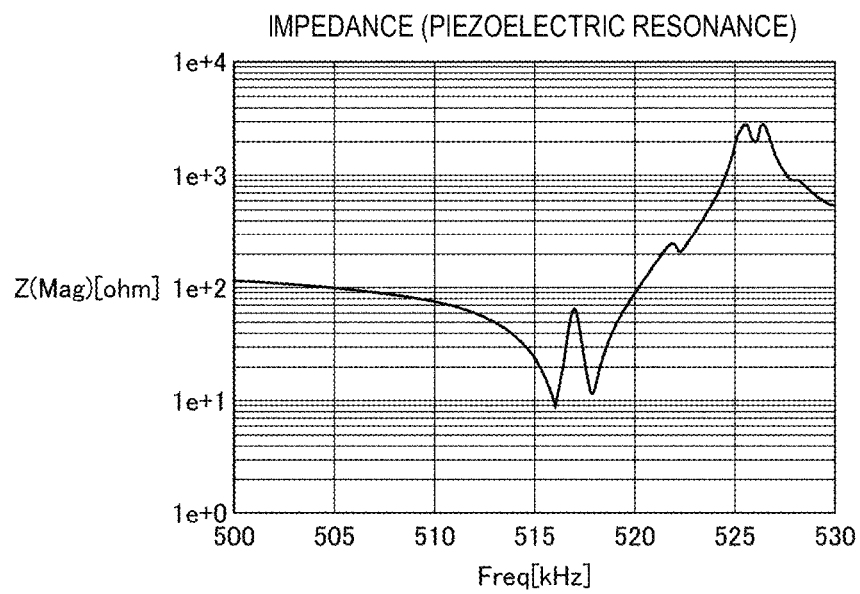
FIG. 4 is a graph illustrating a relationship between frequency and impedance when the vibrating body according to the first preferred embodiment of the present invention is driven in the heating mode.

FIG. 4 is a graph illustrating a relationship between the resonant frequency and the impedance of the piezoelectric vibrator when the vibrating body 13 according to the first preferred embodiment is driven in the heating mode. As seen from FIG. 4, the resonant frequency of the piezoelectric vibrator of the vibrating body 13 is about 516 kHz, and the impedance of the piezoelectric vibrator varies greatly. In this case, the coupling coefficient that provides the efficiency with which electric energy applied to the piezoelectric vibrator is converted into mechanical energy is about 13.236%, which is a large value.

Figure 5A:
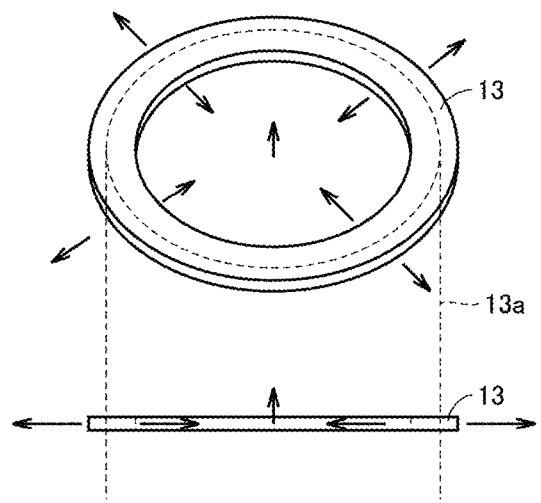
FIGS. 5A and 5B are diagrams illustrating vibration of the vibrating body according to the first preferred embodiment of the present invention.
Figure 5B:
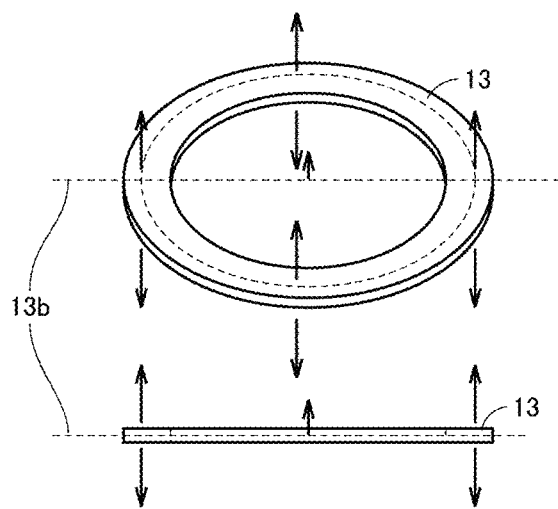

When the vibrating body 13 is driven in the heating mode, the piezoelectric vibrator of the vibrating body 13 is polarized over the entire surfaces of its cylindrical or substantially cylindrical shape and vibrates in a width vibration mode and a higher-order vibration mode of the width vibration mode, or a thickness longitudinal vibration mode. The width vibration mode and the thickness longitudinal vibration mode will now be described. FIGS. 5A and 5B are diagrams illustrating vibration of the vibrating body 13 according to the first preferred embodiment. FIG. 5A illustrates the width vibration of the vibrating body 13. FIG. 5B illustrates the thickness longitudinal vibration of the vibrating body 13.

The vibrating body 13 is able to vibrate in the width vibration mode, in which the vibrating body 13 expands and contracts in the radial direction, as a result of a poling treatment being performed on the entire surfaces of the cylindrical piezoelectric vibrator in the thickness direction. In other words, the width vibration mode is a vibration mode in which a position 13a of the vibrating body 13 expands and contracts in the directions of arrows illustrated in FIG. 5A.

In addition, the vibrating body 13 is able to vibrate in the thickness longitudinal vibration mode, in which the vibrating body 13 expands and contracts in the thickness direction, as a result of a poling treatment being performed on the entire surfaces of the cylindrical piezoelectric vibrator in the thickness direction. In other words, the thickness longitudinal vibration mode is a vibration mode in which a position 13b of the vibrating body 13 expands and contracts in the directions of arrows illustrated in FIG. 5B.

When the vibrating body 13 is vibrated in the heating mode, the efficiency of heating the protective cover 12 is significantly increased by vibrating the vibrating body 13 in a vibration mode with a high coupling coefficient. In addition, by vibrating the top portion of the dome-shaped protective cover 12, heat generation due to the mechanical loss of the vibration on the side on which the piezoelectric vibrator is located, heat generation due to the dielectric loss, and heat generation due to the mechanical loss of the vibration on the side on which the top portion of the dome-shaped protective cover 12 is located occur simultaneously, and the efficiency of heating the protective cover 12 is significantly increased.

Thus, the drive frequency in the heating mode (a second vibration mode) is about 500 kHz and is higher than the drive frequency in the cleaning mode (a first vibration mode), which is about 50 kHz. The drive frequency in the heating mode (the second vibration mode) be is preferable about five times or higher the drive frequency in the cleaning mode (the first vibration mode), for example. However, because the piezoelectric vibrator of the vibrating body 13 vibrates in the width vibration mode and the higher-order vibration mode of the width vibration mode or the thickness longitudinal vibration mode, the drive frequency in the heating mode (the second vibration mode) is set to about 3 MHz or lower.

Figure 6:
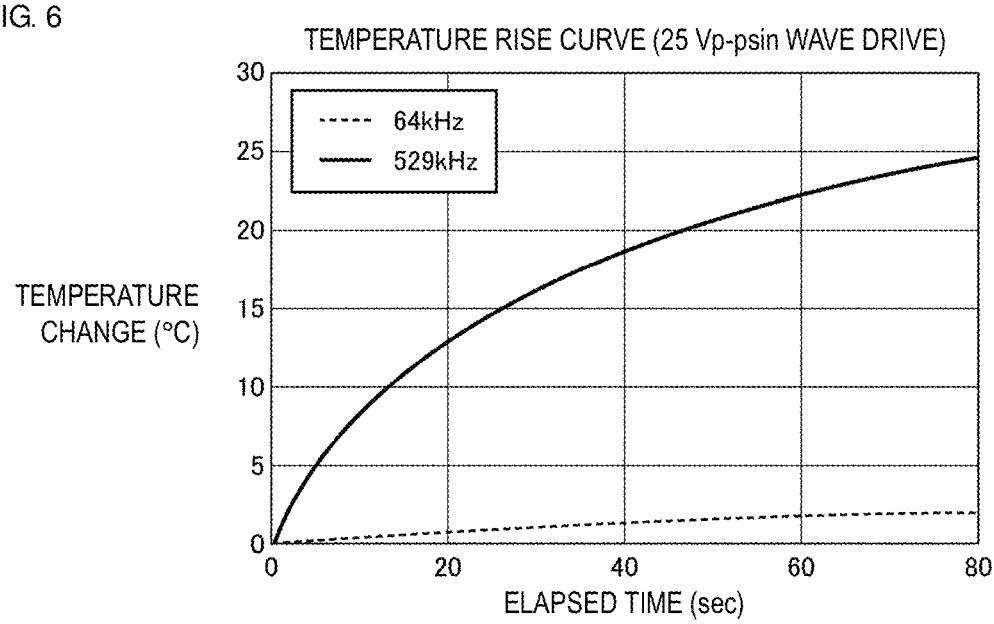
FIG. 6 is a temperature profile of a protective cover 12 when the vibrating body according to the first preferred embodiment of the present invention is driven in the heating mode.

Next, temperature changes in the protective cover 12 when the vibrating body 13 is vibrated in the heating mode will be described. FIG. 6 is a temperature profile of the protective cover 12 when the vibrating body 13 according to the first preferred embodiment is driven in the heating mode. FIG. 6 illustrates temperature changes in the protective cover 12 in the heating mode, in which the vibrating body 13 is driven at about 529 kHz and temperature changes in the protective cover 12 in the cleaning mode, in which the vibrating body 13 is driven at about 64 kHz. Note that a driving signal that is applied to the vibrating body 13 is a signal having a sinusoidal waveform with an amplitude of about 25 V.

As seen from FIG. 6, when the vibrating body 13 is driven in the cleaning mode, the temperature of the protective cover 12 is able to be increased only by about 2° C. as a result of heating the protective cover 12 for 60 seconds. In contrast, when the vibrating body 13 is driven in the heating mode, the temperature of the protective cover 12 is able to be increased by about 22° C. as a result of heating the protective cover 12 for 60 seconds. In other words, in the cleaning mode, a foreign matter (e.g., a waterdrop or the like) adhering to the surface of the protective cover 12 is able to be atomized and removed by vibrating the center or substantially center portion of the protective cover 12 to a large extent without heating the protective cover 12. In contrast, in the heating mode, the protective cover 12 is able to be heated quickly by vibrating the center or substantially center portion of the protective cover 12 to a large extent.

As described above, the optical device 10 according to the first preferred embodiment includes the protective cover 12, which is provided in the viewing direction of the optical sensor 1, the housing 11 at one end of which the protective cover 12 is held, and the vibrating body 13 that vibrates the protective cover 12 by the piezoelectric vibrator (piezoelectric element) provided along the other end of the housing 11. The vibrating body 13 vibrates the protective cover 12 by selecting, from a plurality of vibration modes in which the protective cover 12 is vibrated, the cleaning mode (first vibration mode) in which the vibration displacement of the protective cover 12 becomes maximum and the higher-order heating mode (second vibration mode) in which the number of nodes of vibration (the number of nodes) is larger than that in the first vibration mode. In the heating mode, the position of the maximum vibration displacement in this vibration mode is within the region of the protective cover 12 corresponding to the field of view of the optical sensor 1.

In the optical device 10 according to the first preferred embodiment, since the higher-order heating mode is selected to vibrate the protective cover 12, a foreign matter adhering to the protective cover 12 is able to be removed, and heat is able to be selectively generated within the region of the protective cover 12. In addition, since the position of the maximum vibration displacement 12a in the heating mode is within the region of the protective cover 12 corresponding to the field of view of the optical sensor 1, ice or frost formed within the region of the protective cover 12 corresponding to the field of view of the optical sensor 1 is able to be quickly removed.

The protective cover 12 may be excited in the heating mode by driving the piezoelectric vibrator of the vibrating body 13 in at least one of the width vibration mode, the higher-order vibration mode of the width vibration mode, and the thickness longitudinal vibration mode. As a result, the vibrating body 13 is able to be vibrated in a vibration mode with a high coupling coefficient, and the efficiency of heating the protective cover 12 is significantly increased.

The cleaning mode may be a (n (≥0), 0) vibration mode of the protective cover 12, and the heating mode may be a (m (>n), 0) vibration mode of the protective cover 12. As a result, the efficiency with which the vibrating body 13 heats the protective cover 12 is significantly increased.

In the heating mode, the position of the maximum vibration displacement 12a may be the center or substantially center position in the region of the protective cover 12 corresponding to the field of view of the optical sensor 1. As a result, ice or frost formed at the center or substantially center position in the region of the protective cover 12 corresponding to the field of view of the optical sensor 1 is able to be quickly removed.

The optical unit 100 includes the optical sensor 1 and the above-described optical device 10. Consequently, in the optical unit 100, the higher-order heating mode is selected to vibrate the protective cover 12. Thus, a foreign matter adhering to the protective cover 12 is able to be removed, and heat is able to selectively generated within the region of the protective cover 12.

The optical device according to the first preferred embodiment has been described above in which the vibrating body 13 vibrates the protective cover 12 in the cleaning mode or the heating mode. An optical device according to a second preferred embodiment will now be described in which the vibrating body 13 vibrates the protective cover 12 in the two vibration modes, which are the cleaning mode and the heating mode.

Figure 7:
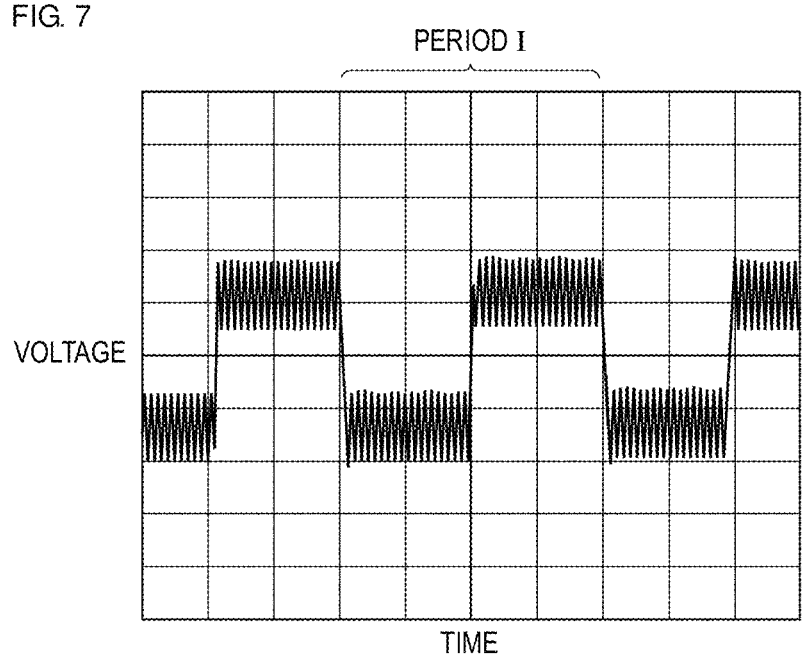
FIG. 7 is a diagram illustrating a driving signal that is supplied to a vibrating body 13 according to a second preferred embodiment of the present invention.
Figure 8:
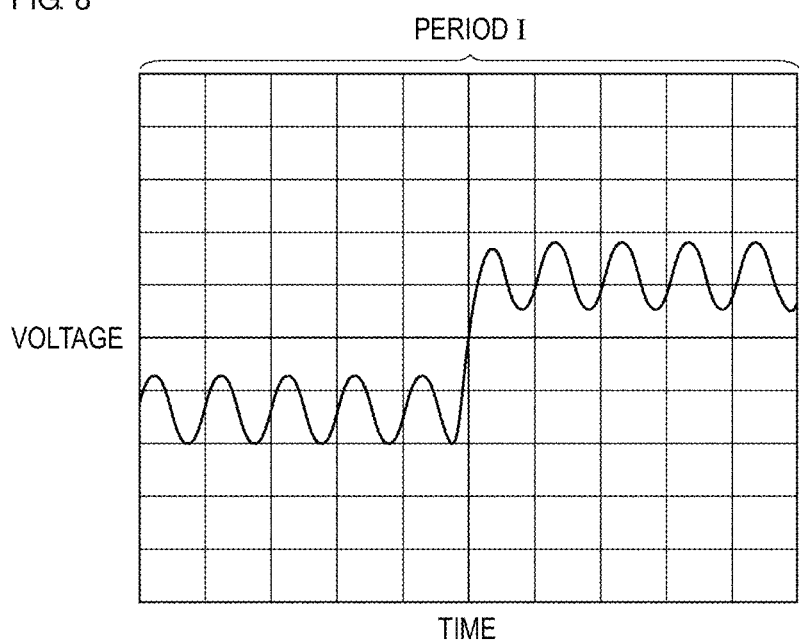
FIG. 8 is an enlarged view of a period I illustrated in FIG. 7.

FIG. 7 is a diagram illustrating a driving signal that is supplied to the vibrating body 13 according to the second preferred embodiment. FIG. 8 is an enlarged view of a period I illustrated in FIG. 7. In FIG. 7 and FIG. 8, the horizontal axis denotes time, and the vertical axis denotes voltage. Note that an optical unit according to the second preferred embodiment includes components that are the same as or similar to the components of the optical unit 100 illustrated in FIGS. 1A and 1B. The same or similar components will be denoted by the same reference signs, and detailed descriptions thereof will not be repeated. In addition, an optical device according to the second preferred embodiment includes components that are the same as or similar to the components of the optical device 10 illustrated in FIGS. 1A and 1B. The same or similar components will be denoted by the same reference signs, and detailed descriptions thereof will not be repeated.

The vibrating body 13 according to the second preferred embodiment vibrates the protective cover 12 in the two vibration modes, which are the cleaning mode and the heating mode, and thus, a driving signal for the cleaning mode and a driving signal for the heating mode are superimposed as illustrated in FIG. 7. In other words, the driving signal illustrated in FIG. 7 is determined by superimposing a driving signal of about 500 kHz to vibrate the protective cover 12 in the heating mode on a driving signal of about 50 kHz to vibrate the protective cover 12 in the cleaning mode. The period I corresponds to one cycle of the driving signal of about 50 kHz, and as seen from FIG. 8, during this one cycle, the driving signal fluctuates with a cycle of about 500 kHz.

The excitation circuit 14 simultaneously applies the driving signal having a frequency (e.g., about 50 kHz) for the cleaning mode, in which the maximum vibration displacement occurs at the top portion of the dome-shaped protective cover 12, and the driving signal having a frequency (e.g., about 500 kHz) for the heating mode, in which the maximum vibration displacement occurs at the top portion of the dome-shaped protective cover 12 and in which the protective cover 12 is heated, to the vibrating body 13, and cleaning of the protective cover 12 and heating of the protective cover 12 are able to be simultaneously performed by superimposing the two vibration modes.

As described above, in the optical device according to the second preferred embodiment, the vibrating body 13 vibrates the protective cover 12 by superimposing the heating mode on the cleaning mode. By superimposing the cleaning mode and the heating mode to vibrate the protective cover 12, removal (cleaning) of a foreign matter adhering to the surface of the protective cover 12 and heating of the protective cover 12 are able to be performed simultaneously, and neither an additional heater nor a controller that controls the additional heater is necessary. Consequently, a reduction in the size of the optical device, a reduction in the manufacturing costs of the optical device, and a significant improvement in the reliability of the optical device are able to be provided. In addition, removal (cleaning) of a foreign matter adhering to the surface of the protective cover 12 and melting of ice or frost formed on the surface of the protective cover 12 are able to be performed simultaneously, and the efficiency of removal of foreign matters is significantly improved. Consequently, the visibility of the optical device is able to be significantly improved in real time.

Note that, in FIG. 7, the driving signal of about 500 kHz to vibrate the protective cover 12 in the heating mode is superimposed on the driving signal of about 50 kHz to vibrate the protective cover 12 in the cleaning mode in each period of the driving signal of about 50 kHz. However, the preferred embodiments of the present invention are not limited to the specific frequencies described above, and the driving signal of about 500 kHz to vibrate the protective cover 12 in the heating mode may be superimposed on the driving signal of about 50 kHz to vibrate the protective cover 12 in the cleaning mode in some periods of the driving signal of about 50 kHz. In other words, the length of time over which the vibrating body 13 is driven to vibrate the protective cover 12 in the heating mode may be shorter than the length of time over which the vibrating body 13 is driven to vibrate the protective cover 12 in the cleaning mode.

As described in the first preferred embodiment, also in the case of driving the vibrating body 13 without superimposing the driving signal to vibrate the protective cover 12 in the cleaning mode and the driving signal to vibrate the protective cover 12 in the heating mode, the driving time in the heating mode may be shorter than the driving time in the cleaning mode.

The optical device according to the first preferred embodiment has been described above in which the protective cover 12 is vibrated in the heating mode, in which the maximum vibration displacement occurs at the top portion of the dome-shaped protective cover 12 and in which the protective cover 12 is heated. An optical device according to a third preferred embodiment of the present invention will now be described in which the protective cover 12 is vibrated in the heating mode in which the maximum vibration displacement occurs at a portion of the protective cover 12 excluding the top portion of the dome-shaped protective cover 12 and in which the protective cover 12 is heated.

As illustrated in FIGS. 3A to 3C, the position of a portion at which the amount of vibration displacement is large (antinode of vibration) and the position of a portion at which the amount of vibration displacement is small (node of vibration) change depending on the frequency of the driving signal to drive the vibrating body 13. Thus, by changing the frequency of the driving signal to drive the vibrating body 13, with the maximum vibration displacement occurring at a peripheral portion of the protective cover 12 excluding the top portion of the dome-shaped protective cover 12, the peripheral portion of the protective cover excluding the top portion of the dome-shaped protective cover is able to be heated by mechanical loss of vibration.

Figure 9A:
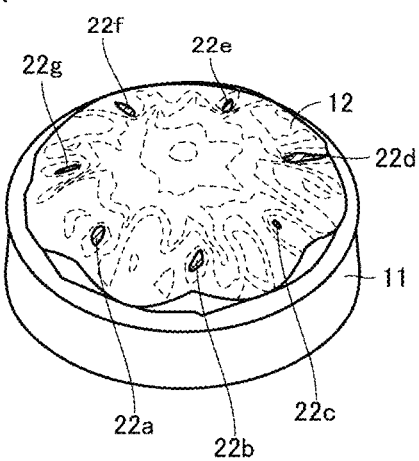
FIGS. 9A and 9B are diagrams illustrating a result of FEM analysis in the case where a vibrating body according to a third preferred embodiment of the present invention is driven in the heating mode.
Figure 9B:
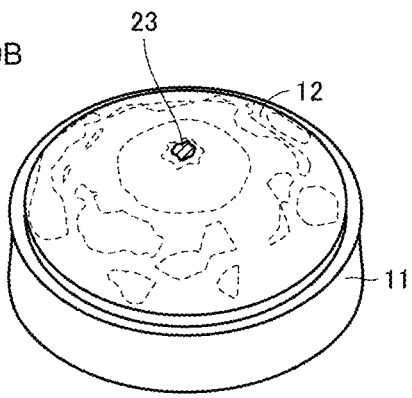

FIGS. 9A and 9B are diagrams illustrating a result of FEM analysis in the case where the vibrating body according to the third preferred embodiment is driven in the heating mode. FIG. 9A illustrates a result of FEM analysis in the case where the vibrating body 13 is driven by the driving signal having a frequency at which the maximum vibration displacement occurs at a peripheral portion of the protective cover 12 excluding the top portion of the dome-shaped protective cover 12. FIG. 9B illustrates a result of FEM analysis in the case where the vibrating body 13 is driven by the driving signal having a frequency at which the maximum vibration displacement occurs at the top portion of the dome-shaped protective cover 12.

FIG. 9A illustrates a vibration mode in which maximum vibration displacement portions 22a to 22g are located at a peripheral portion of the protective cover 12 excluding the top portion of the dome-shaped protective cover 12, and the protective cover 12 is able to be heated by the mechanical loss of the vibration at the positions of the maximum vibration displacement portions 22*a* to 22*g*. FIG. 9B illustrates a vibration mode in which a maximum vibration displacement portion 23 is located at the top portion of the dome-shaped protective cover 12, and the protective cover 12 is able to be heated by the mechanical loss of the vibration at the position of the maximum vibration displacement portion 23.

The excitation circuit 14 illustrated in FIGS. 1A and 1B is able to change frequency in order to switch between the vibration mode in which the maximum vibration displacement portions 22*a* to 22*g* are located at the positions illustrated in FIG. 9A and the vibration mode in which the maximum vibration displacement portion 23 is located at the position illustrated in FIG. 9B. In other words, the excitation circuit 14 also defines and functions as a switch that switches the vibration mode in which the protective cover 12 is vibrated.

As described above, in the optical device according to the third preferred embodiment, the excitation circuit 14 is able to switch to, as the heating mode, a vibration mode in which the maximum vibration displacement occurs at a position where heat is to be generated within the region of the protective cover 12 corresponding to the field of view of the optical sensor 1 in accordance with the position. As a result, an arbitrary portion of the protective cover 12 is able to be selected to be heated.

Figure 10A:
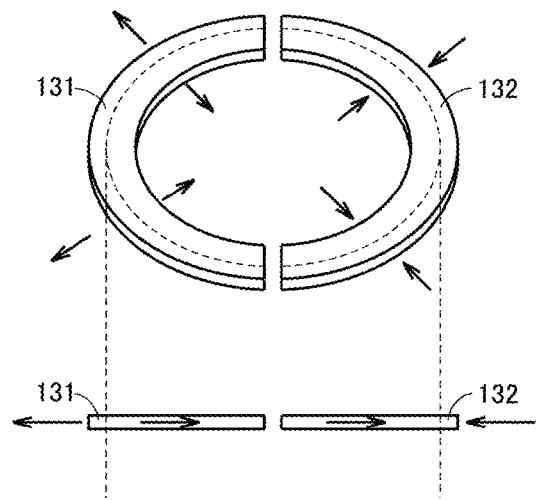
FIGS. 10A and 10B are diagrams illustrating vibration of the vibrating body according to the third preferred embodiment of the present invention.
Figure 10B:
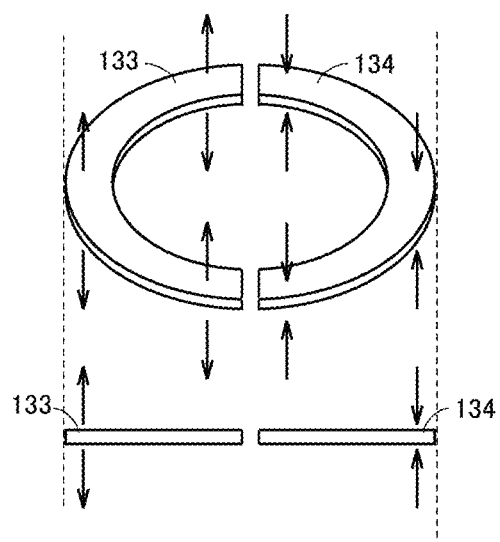

Note that, in order to easily change the position at which the maximum vibration displacement of the protective cover 12 occurs, instead of performing a poling treatment on the entire surfaces of the cylindrical piezoelectric vibrator of the vibrating body 13 in the thickness direction, the piezoelectric vibrator is preferably divided into a plurality of portions and a poling treatment is preferably performed on the piezoelectric vibrator, for example. FIGS. 10A and 10B are diagrams illustrating vibration of the vibrating body according to the third preferred embodiment. FIGS. 10A and 10B illustrate the case in which the piezoelectric vibrator of the vibrating body 13 is split into, for example, two portions and in which each of the piezoelectric vibrator portions is vibrated in the width vibration mode and the thickness longitudinal vibration mode. In FIG. 10A, vibrating bodies 131 and 132, which are determined by splitting the vibrating body 13 into two portions, are vibrated in the width vibration mode. In FIG. 10B, vibrating bodies 133 to 140, which are determined by splitting the vibrating body 13 into eight portions, are vibrated in the thickness longitudinal vibration mode.

The two separate vibrating bodies 131 and 132 are oppositely polarized to each other, or signals whose electric potentials are reversed to have phases differing from each other by about 180 degrees are applied to the vibrating body 131 and the vibrating body 132. As a result, as illustrated in FIG. 10A, vibration by which the vibrating body 131 expands in the horizontal direction indicated by arrows is excited, and vibration by which the vibrating body 132 contracts in the horizontal direction indicated by arrows is excited.

The two separate vibrating bodies 133 and 134 are oppositely polarized to each other, or signals whose electric potentials are reversed to have phases differing from each other by about 180 degrees are applied to the vibrating body 133 and the vibrating body 134. As a result, as illustrated in FIG. 10B, vibration by which the vibrating body 133 expands in the thickness direction indicated by arrows is excited, and vibration by which the vibrating body 134 contracts in the thickness direction indicated by arrows is excited.

By combining the vibrating bodies illustrated in FIGS. 10A and 10B, various vibration modes are able to be easily provided. In other words, by inverting portions of the vibrating bodies that vibrate in the uniform vibration directions illustrated in FIGS. 10A and 10B, the protective cover 12 is able to be vibrated in a new vibration mode that has a node in the radial direction and in which the direction of vibration is reversed at a split axis. When the protective cover 12 is vibrated in a vibration mode, the protective cover 12 is able to be excited with higher efficiency than in the vibration mode illustrated in FIG. 9A as an example, and the bottom of the protective cover 12 is able to be effectively heated. In addition, for example, a vibrating body that is one of two vibrating bodies determined by splitting a single vibrating body into two portions is driven in the thickness longitudinal vibration mode, and the protective cover 12 is able to be locally heated by being vibrated only in the thickness direction. Note that, although FIGS. 10A and 10B illustrate the case where the vibrating body is split into two portions, the preferred embodiments of present invention is not limited to the specific structure and operation described above, and the vibrating body may be split into three or more portions. In other words, the protective cover 12 is vibrated by a piezoelectric vibrator that has been divided into a plurality of portions and that has undergone a poling treatment, and the excitation circuit 14 is able to easily switch to, as the heating mode, a vibration mode in which the maximum vibration displacement occurs at a position where heat is to be generated within the region of the protective cover 12 corresponding to the field of view of the optical sensor 1 in accordance with the position. As a result, an arbitrary portion of the protective cover 12 is able to be selected to be heated.

Although the protective cover 12 has a dome shape in each of the optical devices according to the above-described preferred embodiments, the protective cover 12 may have a plate shape.

Each of the optical units according to the above-described preferred embodiments may include a camera, a LiDAR, a Rader, or the like.

Each of the optical units according to the above-described preferred embodiments is not limited to an optical unit that is mounted onto a vehicle, and the preferred embodiments of the present invention are also able to be applied to an optical unit for applications to clean a light transmitter that is provided in the field of view of the optical sensor.

In the descriptions of the optical units according to the above preferred embodiments, although the vibrating body or a rotation mechanism, which is an alternative to the vibrating body, has been described as the removing structure that removes a foreign matter adhering to the surface of the protective cover, the removing structure is not limited to the vibrating body or a rotation mechanism. Instead of being a vibrating body, the removing structure may include any components or element as long as the removing structure is able to remove a foreign matter adhering to the surface of the protective cover, and, for example, the removing structure may be a mechanism that includes a wiper to physically remove a foreign matter or may be a mechanism that removes a foreign matter by controlling a discharge device to discharge a cleaner (a cleaning liquid, air, or the like).

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An optical device comprising:
   a light transmitter that is provided in a viewing direction of an optical sensor;
   a housing at one end of which the light transmitter is secured to a surface of the housing; and
   a vibrating body to vibrate the light transmitter via a piezoelectric element secured to a surface of the housing at another end of the housing; wherein
   the vibrating body is connected to an excitation circuit;
   based on a signal of the excitation circuit, the vibrating body is to vibrate vibrates the light transmitter in at least one of a plurality of vibration modes, the plurality of vibration modes including a first vibration mode in which vibration displacement of the light transmitter becomes maximum and a higher-order second vibration mode in which a number of nodes is larger than the number of nodes in the first vibration mode;
   the excitation circuit is configured to vibrate the vibrating body in each of the plurality of vibration modes;
   in the second vibration mode, a position of a maximum vibration displacement in the second vibration mode is within a region of the light transmitter that corresponds to a field of view of the optical sensor; and
   the maximum vibration displacement is larger than any other vibration displacement of the light transmitter in the second vibration mode.

2. The optical device according to claim 1, wherein a drive frequency of the second vibration mode is about five times or higher a drive frequency in the first vibration mode.

3. The optical device according to claim 2, wherein the drive frequency of the second vibration mode is about 3 MHz or lower.

4. The optical device according to claim 1, wherein the light transmitter is excited in the second vibration mode by driving the piezoelectric element in at least one of a width vibration mode, a higher-order vibration mode of the width vibration mode, and a thickness longitudinal vibration mode.

5. The optical device according to claim 1, wherein the first vibration mode is a (n (≥0), 0) vibration mode of the light transmitter, and the second vibration mode is a (m (>n), 0) vibration mode of the light transmitter.

6. The optical device according to claim 1, wherein the vibrating body vibrates the light transmitter by superimposing the second vibration mode on the first vibration mode.

7. The optical device according to claim 1, wherein a length of time over which the vibrating body is driven to vibrate the light transmitter in the second vibration mode is shorter than a length of time over which the vibrating body is driven to vibrate the light transmitter in the first vibration mode.

8. The optical device according to claim 1, wherein, in the second vibration mode, the position of the maximum vibration displacement is a center or substantially center position in the region of the light transmitter corresponding to the field of view of the optical sensor.

9. The optical device according to claim 1, further comprising:
   a switch to switch between the plurality of vibration modes in which the light transmitter is vibrated; and
   in the second vibration mode, the maximum vibration displacement occurs at a position at which heat is to be generated within the region of the light transmitter corresponding to the field of view of the optical sensor in accordance with the position.

10. The optical device according to claim 1, wherein the piezoelectric element has been poling-treated in a thickness direction.

11. The optical device according to claim 1, wherein the housing has a cylindrical or substantially cylindrical shape.

12. The optical device according to claim 1, wherein the light transmitter has a dome shape extending from the one end of the housing.

13. The optical device according to claim 1, wherein the light transmitter is a flat or substantially flat plate.

14. The optical device according to claim 1, further comprising:
   a second vibrating body that vibrates the light transmitter by a second piezoelectric element provided along the another end of the housing; wherein
   the vibrating body and the second vibrating body vibrate with phases that differ from each other by about 180 degrees.

15. The optical device according to claim 14, wherein the piezoelectric element of the vibrating body and the second piezoelectric element of the second vibrating body are defined by at least two split piezoelectric element portions.

16. The optical device according to claim 1, wherein the first vibration mode is a cleaning mode and the second vibration mode is a heating mode.

17. An optical device comprising:
   a light transmitter that is provided in a viewing direction of an optical sensor;
   a housing at one end of which the light transmitter is secured to a surface of the housing;
   a vibrating body to vibrate the light transmitter via a piezoelectric element secured to a surface of the housing at another end of the housing; and
   a switch to switch a vibration mode in which the light transmitter is vibrated; wherein
   based on the switch, the vibrating body vibrates the light transmitter in at least one of a plurality of vibration modes, the plurality of vibration modes including a first vibration mode in which vibration displacement of the light transmitter becomes maximum and a higher-order second vibration mode in which a number of nodes is larger than the number of nodes in the first vibration mode;
   the switch is configured to switch between each of the plurality of vibration modes;
   in the second vibration mode, a maximum vibration displacement occurs at a position in the region of the light transmitter corresponding to the field of view of the optical sensor in accordance with the position; and
   the maximum vibration displacement is larger than any other vibration displacement of the light transmitter in the second vibration mode.

18. The optical device according to claim 17, wherein the piezoelectric element has been poling-treated in a thickness direction or has been divided into a plurality of portions and has undergone a poling treatment.

19. The optical device according to claim 17, wherein the housing has a cylindrical or substantially cylindrical shape.

20. The optical device according to claim 17, wherein the first vibration mode is a cleaning mode and the second vibration mode is a heating mode.

21. An optical unit comprising:
the optical sensor; and
the optical device according to claim 1.

22. The optical unit according to claim 21, wherein the optical sensor is an image sensor or a light detection and ranging sensor.

* * * * *